United States Patent
Lee et al.

(10) Patent No.: US 12,396,267 B2
(45) Date of Patent: Aug. 19, 2025

(54) SEMICONDUCTOR DEVICE

(71) Applicant: Vanguard International Semiconductor Corporation, Hsinchu (TW)

(72) Inventors: Jian-Hsing Lee, Hsinchu (TW); Yeh-Jen Huang, Hsinchu (TW); Li-Yang Hong, Taoyuan (TW); Yu-Hao Ho, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 269 days.

(21) Appl. No.: 18/105,226

(22) Filed: Feb. 2, 2023

(65) Prior Publication Data
US 2024/0266347 A1    Aug. 8, 2024

(51) Int. Cl.
    *H10D 89/60*    (2025.01)
(52) U.S. Cl.
    CPC ............................... *H10D 89/813* (2025.01)
(58) Field of Classification Search
    CPC ........................... H10D 89/813; H10D 30/603
    See application file for complete search history.

(56) References Cited

U.S. PATENT DOCUMENTS

| | | | | |
|---|---|---|---|---|
| 6,831,331 B2 * | 12/2004 | Kitamura | ............. | H10D 12/441 257/493 |
| 6,858,901 B2 | 2/2005 | Ker | | |
| 8,049,307 B2 * | 11/2011 | Jou | ....................... | H10D 12/411 257/575 |
| 8,278,714 B2 * | 10/2012 | Takasu | .................. | H10D 89/811 257/529 |
| 8,310,010 B2 * | 11/2012 | Okushima | ............. | H10D 89/811 257/E29.112 |
| 11,476,244 B2 * | 10/2022 | Mahajan | ............ | H01L 21/76224 |
| 12,237,323 B2 * | 2/2025 | Hsu | .................... | H01L 21/28097 |
| 2002/0063267 A1 * | 5/2002 | Kumagai | ................ | H10B 10/12 257/E27.099 |

(Continued)

FOREIGN PATENT DOCUMENTS

| TW | 200410391 | 6/2004 |
|---|---|---|
| TW | 201030932 A1 | 8/2010 |

(Continued)

OTHER PUBLICATIONS

Lin ,"Enhance the ESD Ability of Uhv 300-V Circular LDMOS Components by Embedded SCRs and the Robustness P-body Well," IEEE Journal of the Electron Devices Society, vol. 9, pp. 108-113, Jan. 28, 2021.

*Primary Examiner* — Eugene Lee
(74) *Attorney, Agent, or Firm* — Winston Hsu (57) ABSTRACT

A semiconductor device includes a gate electrode disposed on a substrate. A source region and a drain region are disposed in the substrate and located on two sides of the gate electrode respectively. The drain region includes a plurality of drain segments that are laterally separated from each other. These drain segments have a first conductive type and the substrate has a second conductive type. A plurality of drain contacts is electrically connected to the drain segments. Each drain segment corresponds to at least one of these drain contacts. A drain electrode is electrically connected to these drain contacts. A source electrode is electrically connected to the source region.

18 Claims, 7 Drawing Sheets

(56) References Cited

U.S. PATENT DOCUMENTS

| | | | |
|---|---|---|---|
| 2006/0284258 A1* | 12/2006 | Huang | H10D 84/038 |
| | | | 257/357 |
| 2009/0152633 A1* | 6/2009 | Takasu | H10D 84/038 |
| | | | 257/360 |
| 2010/0200922 A1* | 8/2010 | Sheu | H10D 30/0221 |
| | | | 257/E21.409 |
| 2018/0166438 A1* | 6/2018 | Linewih | H10D 30/0221 |
| 2021/0175226 A1* | 6/2021 | Song | H10D 89/814 |

FOREIGN PATENT DOCUMENTS

| | | |
|---|---|---|
| TW | 201712844 A | 4/2017 |
| TW | 201841333 A | 11/2018 |

* cited by examiner

SEMICONDUCTOR DEVICE

BACKGROUND OF THE INVENTION

1. Field of the Invention

The present disclosure relates generally to semiconductor devices, and in particular to semiconductor devices having electrostatic protection capability.

2. Description of the Prior Art

In order to prevent integrated circuits from being damaged by electrostatic discharge (ESD) during the manufacturing processes and/or under operation, an ESD protection component is usually provided in the integrated circuits. The ESD protection component provides a current path for ESD to avoid the current flowing into an internal circuit and causing damage in the integrated circuits. Generally, the ESD protection component is turned off under the normal operation of the integrated circuits and turned on during an ESD event.

Since no component can be turned on quicker than an initial-on device, the conventional ESD protection component cannot effectively protect the initial-on device. In addition, for the ESD protection of ultra-high voltage (UHV) devices, adding ESD protection components will increase the layout area of the UHV devices, which is not conducive to the requirement for reducing the sizes of the UHV devices.

SUMMARY OF THE INVENTION

In view of this, the present disclosure provides semiconductor devices, where a drain region is divided into a plurality of drain segments that are laterally separated from each other and electrically connected to a drain electrode in parallel through a plurality of drain contacts. The drain contacts may correspond to the drain segments, respectively, thereby spreading the current to the entire drain region during electrostatic discharge event. Therefore, the ESD protection capability of an initial-on semiconductor device is improved without increasing the layout area of the semiconductor device.

According to an embodiment of the present disclosure, a semiconductor device is provided and includes a substrate, a gate electrode, a source region, a drain region, a plurality of drain contacts, a drain electrode and a source electrode. The gate electrode is disposed on the substrate. The source region and the drain region are disposed in the substrate and located on two opposite sides of the gate electrode, respectively. The drain region includes a plurality of drain segments that are laterally separated from each other. These drain segments have a first conductivity type, and the substrate has a second conductivity type. These drain contacts are disposed on the drain region and electrically connected to these drain segments. Each drain segment corresponds to at least one drain contact. The drain electrode is electrically connected to these drain contacts. The source electrode is electrically connected to the source region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to semiconductor devices that improve the electrostatic discharge (ESD) protection capability of initial-on semiconductor devices. According to some embodiments of the present disclosure, a drain region of the semiconductor devices is divided into a plurality of drain segments that are laterally separated from each other. In addition, a plurality of drain contacts is provided to be electrically connected to the drain region. Each drain segment corresponds to at least one drain contact. These drain contacts are electrically connected to a drain electrode in parallel for spreading the ESD current to the entire drain region, thereby improving the ESD protection capability of the semiconductor device itself without increasing the layout area of the semiconductor device.

Figure 1:
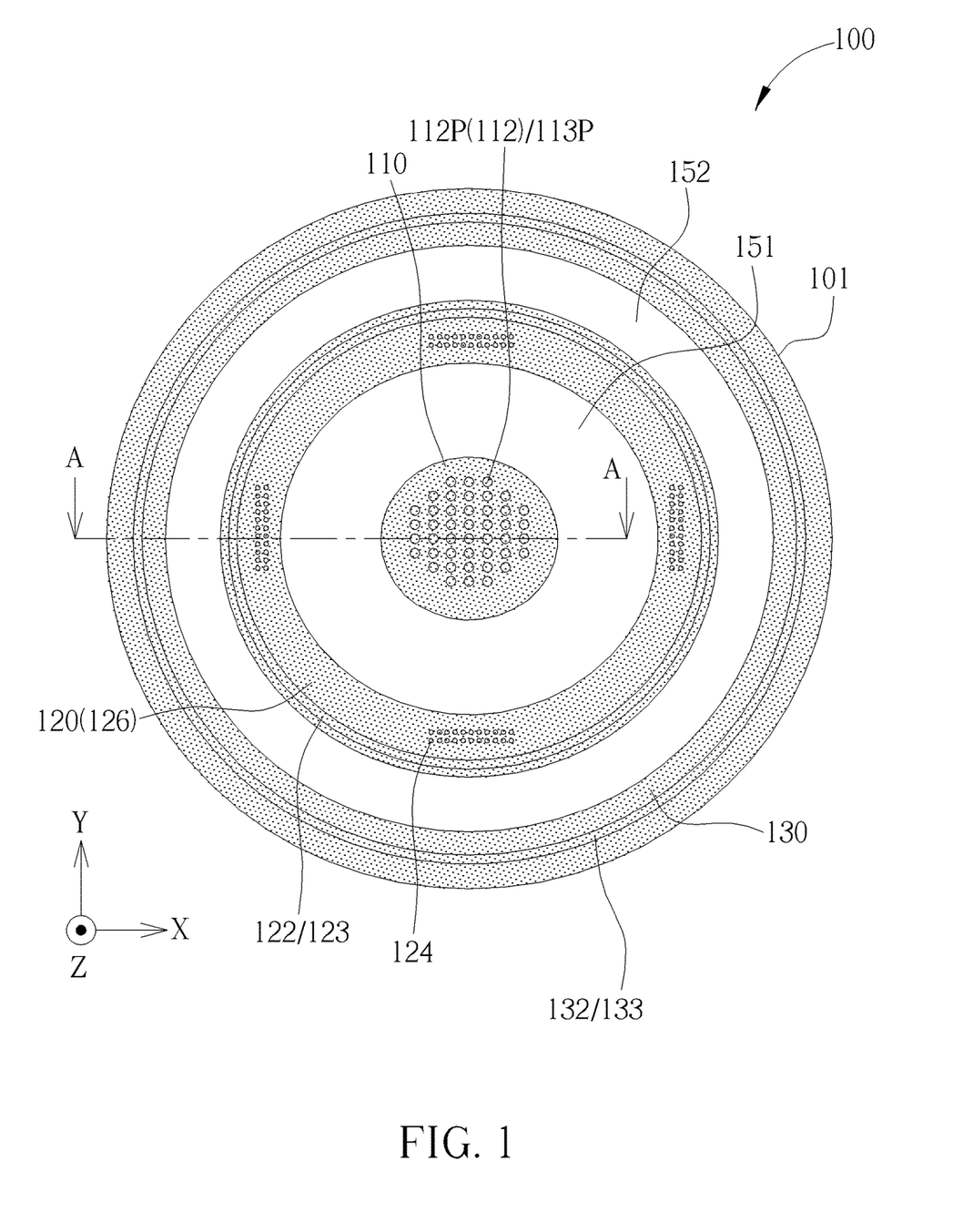
FIG. 1 is a schematic top view of a semiconductor device according to an embodiment of the present disclosure.

FIG. 1 is a schematic top view of a semiconductor device 100 according to an embodiment of the present disclosure. In one embodiment, a layout of the semiconductor device 100 in a top view includes a drain electrode 110 having a circular shape and disposed on a substrate 101. A gate electrode 120 is also disposed on the substrate 101 and has an annular shape surrounding the drain electrode 110. A source electrode 130 is also disposed on the substrate 101 and has another annular shape surrounding the gate electrode 120. The semiconductor device 100 further includes a source region 132 and a drain region 112 disposed in the substrate 101 and located on two opposite sides of the gate electrode 120 respectively. The distance between the drain region 112 and the gate electrode 120 is greater than the distance between the source region 132 and the gate electrode 120. According to some embodiments of the present disclosure, the drain region 112 includes a plurality of drain segments 112P that are laterally separated from each other. In one embodiment, as shown in FIG. 1, in a layout from a top view, these drain segments 112P are, for example, multiple circular regions that are laterally separated from each other. In addition, a plurality of drain contacts 113P is disposed on the drain region 112 and electrically connected to the drain segments 112P. Each drain segment 112P corresponds to at least one drain contact 113P, i.e., each drain segment 112P may correspond to one or more drain contacts 113P. These drain contacts 113P are electrically connected to the drain electrode 110 in parallel. In the layout from a top view, these drain segments 112P and these drain contacts 113P are located within the area of the circular shape of the drain electrode 110.

As shown in FIG. 1, in the layout from a top view, the gate electrode 120 may be electrically connected to a gate contact region 122 in the substrate 101 through at least one annular gate contact 123, i.e., one or more annular gate contacts 123. Moreover, the gate electrode 120 may also be electrically connected to a field plate (not shown) through a plurality of contacts 124. The one or more annular gate contacts 123 and these contacts 124 are located in the area of the annular shape of the gate electrode 120. In addition, the source electrode 130 may be electrically connected to the source region 132 in the substrate 101 through at least one annular source contact 133, i.e., one or more annular source contacts 133. The aforementioned one or more annular source contacts 133 are located within the area of the annular shape of the source electrode 130. Furthermore, a first isolation region 151 is disposed between the gate contact region 122 and the drain region 112. A second isolation region 152 is disposed between the gate contact region 122 and the source region 132. In some embodiments, the first isolation region 151 and the second isolation region 152 may be an annular field oxide layer (FOX) or an annular shallow trench isolation region (STI).

Figure 2:
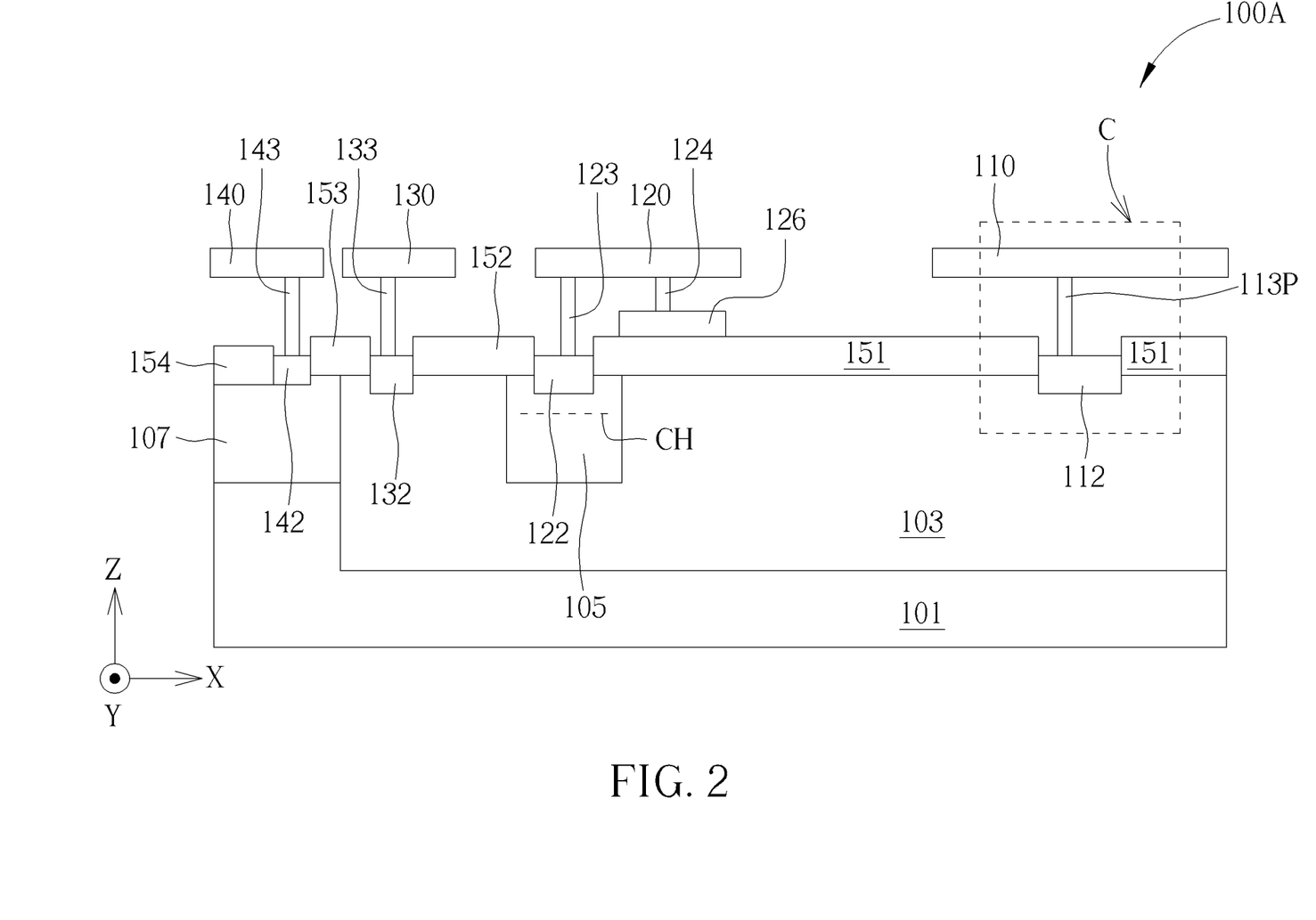
FIG. 2 is a schematic cross-sectional view of a semiconductor device along the line A-A in FIG. 1 according to an embodiment of the present disclosure.

FIG. 2 is a schematic cross-sectional view of a semiconductor device 100A along the line A-A in FIG. 1 according to an embodiment of the present disclosure. In one embodiment, the semiconductor device 100A is a junction field effect transistor (JFET), which is an initial-on semiconductor device. As shown in FIG. 2, the semiconductor device 100A includes a first well region 103 disposed in the substrate 101. The first well region 103 has a first conductivity type, such as a high voltage n-type well region (HVNW). The substrate 101 has a second conductivity type opposite to the first conductivity type, such as a p-type silicon substrate (PSUB). The source region 132 and the drain region 112 are disposed in the first well region 103. Both the source region 132 and the drain region 112 have the first conductivity type, such as n-type heavily doped regions ($N^+$). The source region 132 is electrically connected to the source electrode 130 through the source contact 133. The drain region 112 is electrically connected to the drain electrode 110 through the multiple drain contacts 113P. In order to make the drawing clear and easy to understand, FIG. 2 shows a simplified drawing of the drain region 112 and the drain contact 113P. The detailed structure of the drain region 112 and the drain contact 113P in the area C of FIG. 2 may refer to the following descriptions of FIG. 3 and FIG. 4.

Still referring to FIG. 2, the semiconductor device 100A further includes a second well region 105 disposed in the first well region 103. The second well region 105 has the second conductivity type, such as a p-type well region (PW). The gate contact region 122 is disposed in the second well region 105. The gate contact region 122 has the second conductivity type, such as a p-type heavily doped region (P$^+$). The gate contact region 122 is electrically connected to the gate electrode 120 through the gate contact 123. Moreover, the first isolation region 151 is disposed between the drain region 112 and the gate contact region 122, and the first isolation region 151 surrounds the drain region 112. The second isolation region 152 is disposed between the source region 132 and the gate contact region 122, and the second isolation region 152 surrounds the gate contact region 122. In one embodiment, both the first isolation region 151 and the second isolation region 152 may be a field oxide layer (FOX), and are located on the first well region 103.

In addition, the semiconductor device 100A further includes a field plate 126 disposed on the first isolation region 151. The field plate 126 is electrically connected to the gate electrode 120 through these contacts 124. In one embodiment, the field plate 126 may be formed of polysilicon. Moreover, the semiconductor device 100A includes a third well region 107 disposed in the substrate 101 and adjacent to the first well region 103. The third well region 107 has the second conductivity type, such as a p-type well region (PW). A bulk contact region 142 is disposed in the third well region 107 and has the second conductivity type, such as a p-type heavily doped region (P$^+$). The bulk contact region 142 is electrically connected to a bulk electrode 140 through a bulk contact 143. The source electrode 130 is located between the bulk electrode 140 and the gate electrode 120. In addition, a third isolation region 153 is disposed between the bulk contact region 142 and the source region 132, and the third isolation region 153 surrounds the source region 132. A fourth isolation region 154 is disposed outside the bulk contact region 142 and surrounds the bulk contact region 142. In one embodiment, the third isolation region 153 and the fourth isolation region 154 may both be a field oxide layer (FOX). The third isolation region 153 is located at the interface between the first well region 103 and the third well region 107. The fourth isolation region 154 is located on the third well region 107. In some embodiments, the bottom surface of the first well region 103 is lower than the bottom surface of the second well region 105 and the bottom surface of the third well region 107. The second well region 105 and the third well region 107 are laterally separated from each other, such as separated from each other along the X-axis direction. Moreover, a portion of the first well region 103 is located between the second well region 105 and the third well region 107. In this embodiment, the semiconductor device 100A is an n-channel junction field effect transistor. When no voltage is applied to the gate electrode 120, a channel region CH between the source region 132 and the drain region 112 is turned on, i.e., the n-channel junction field effect transistor is an initial-on semiconductor device.

Figure 3:
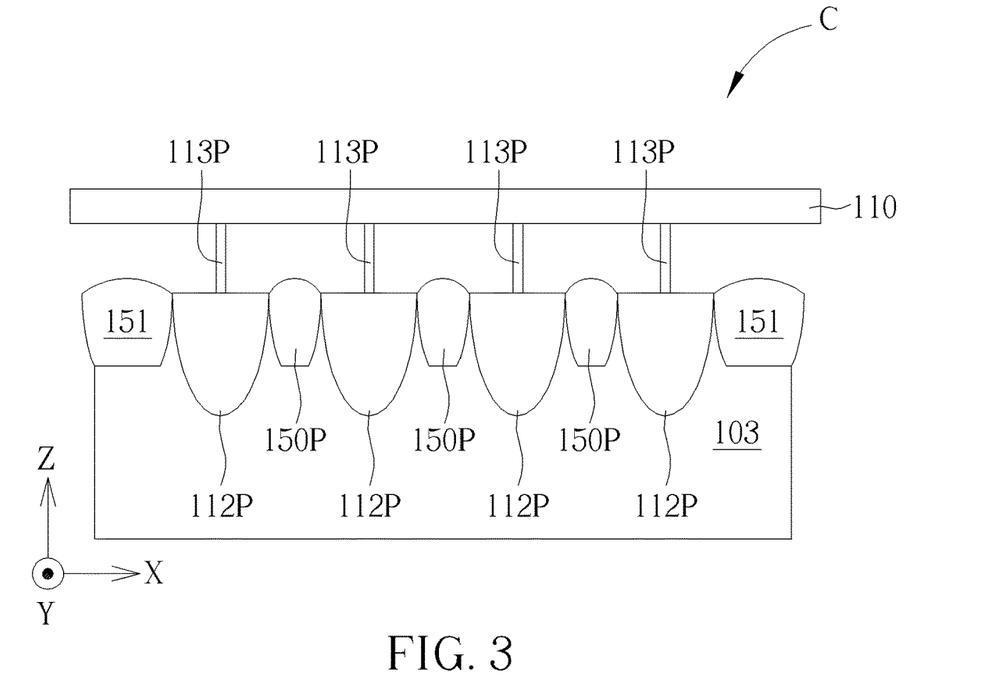
FIG. 3 is a schematic partial cross-sectional view of a semiconductor device in the area C of FIG. 2 according to an embodiment of the present disclosure.

FIG. 3 is a schematic partial cross-sectional view of the semiconductor device 100A in the area C of FIG. 2 according to an embodiment of the present disclosure. As shown in FIG. 3, in one embodiment, the drain region 112 of the semiconductor device 100A includes a plurality of drain segments 112P that are laterally separated from each other. These drain segments 112P have the first conductivity type, such as n-type heavily doped regions (N$^+$). In addition, a plurality of isolation blocks 150P is also disposed in the drain region 112 and respectively located between the adjacent drain segments 112P. These drain segments 112P are separated from each other by these isolation blocks 150P. In some embodiments, each of the isolation blocks 150P may be a field oxide layer (FOX) or a shallow trench isolation region (STI). The isolation blocks 150P and the drain segments 112P are all disposed in the first well region 103. The bottom surfaces of the drain segments 112P may be lower than the bottom surfaces of the isolation blocks 150P. In one embodiment, in a layout from a top view, the isolation blocks 150P may construct a grid structure, and the drain segments 112P are located in the lattices of the grid structure. In one embodiment, firstly, these isolation blocks 150P may be formed in the first well region 103. Then, in an ion implantation process for forming these drain segments 112P, the grid structure constructed by these isolation blocks 150P may be used as a mask in the ion implantation process. In addition, the semiconductor device 100A also includes a plurality of drain contacts 113 electrically connected to these drain segments 112P, respectively. Each drain segment 112P corresponds to at least one drain contact 113. Moreover, these drain contacts 113 are electrically connected to the drain electrode 110 in parallel.

Figure 4:
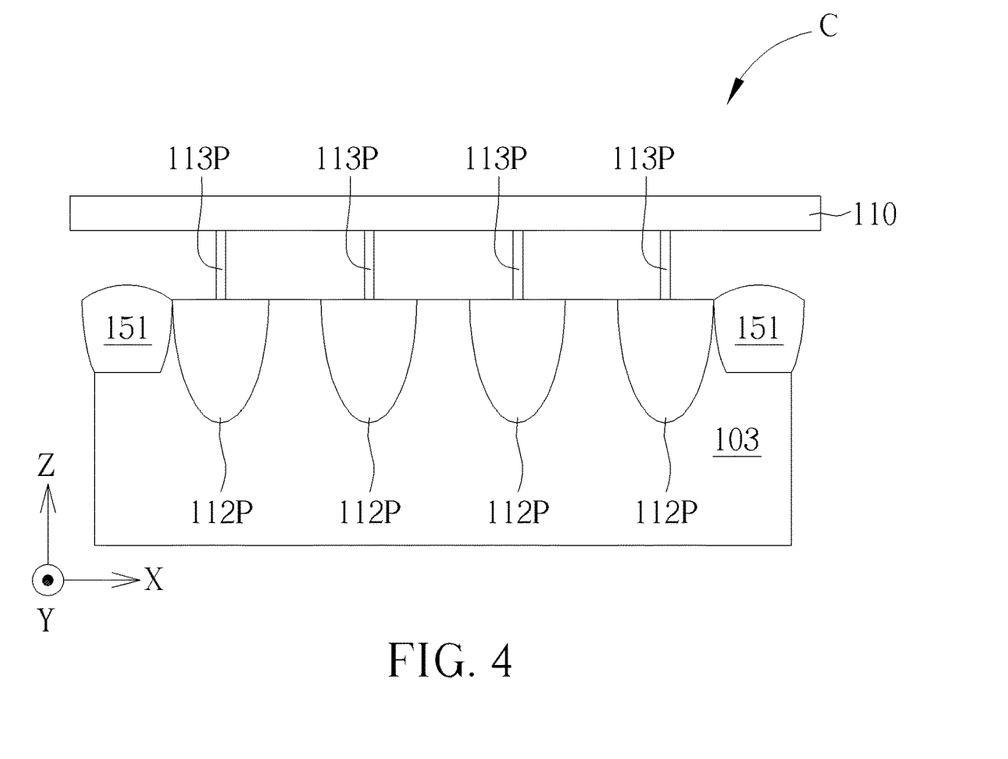
FIG. 4 is a schematic partial cross-sectional view of a semiconductor device in the area C of FIG. 2 according to another embodiment of the present disclosure.

FIG. 4 is a schematic partial cross-sectional view of the semiconductor device 100A in the area C of FIG. 2 according to another embodiment of the present disclosure. In the embodiment of FIG. 4, there is no isolation block disposed between these drain segments 112P that are laterally separated from each other. A patterned mask may be used in an ion implantation process for forming these drain segments 112P, so that these drain segments 112P are separated from each other in the first well region 103. Moreover, multiple drain contacts 113 are electrically connected to these drain segments 112P, respectively. Each drain segment 112P corresponds to at least one drain contact 113. Furthermore, these drain contacts 113 are electrically connected to the drain electrode 110 in parallel.

According to the embodiments of the present disclosure, the drain region 112 of the semiconductor device 100 is divided into multiple drain segments 112P that are laterally separated from each other. Each drain segment 112P corresponds to and is electrically connected to at least one drain contact 113P. These drain segments 112P are electrically connected to the drain electrode 110 in parallel through these drain contacts 113P, and each drain segment 112P may be regarded as a small resistor. During electrostatic discharge (ESD) event, the small resistor constructed by each drain segment 112P independently bears the ESD energy, and the ESD current flows into each drain segment 112P evenly through each drain contact 113P, thereby spreading the ESD current to each drain segment 112P to lower the potential of the entire drain region 112. Therefore, the ability of the semiconductor devices of the present disclosure to withstand ESD is improved to obtain better ESD protection capability.

In addition, according to the embodiments of the present disclosure, the ESD protection function of the semiconductor device 100 is kept turn-on under normal operation, so that for the initial-on semiconductor devices, there is no problem of slow turn-on in the ESD protection component of the semiconductor device 100. Moreover, in the embodiments of the present disclosure, the ESD protection component of the semiconductor device 100 is provided by these drain segments 112P. Therefore, the ESD protection component will not occupy the layout area of the semiconductor device, which is beneficial to the miniaturization of the size of the semiconductor device. Moreover, the semiconductor device of the present disclosure has the ESD protection capability by itself, which is beneficial to the application for ultra-high voltage (UHV) devices.

Figure 5:
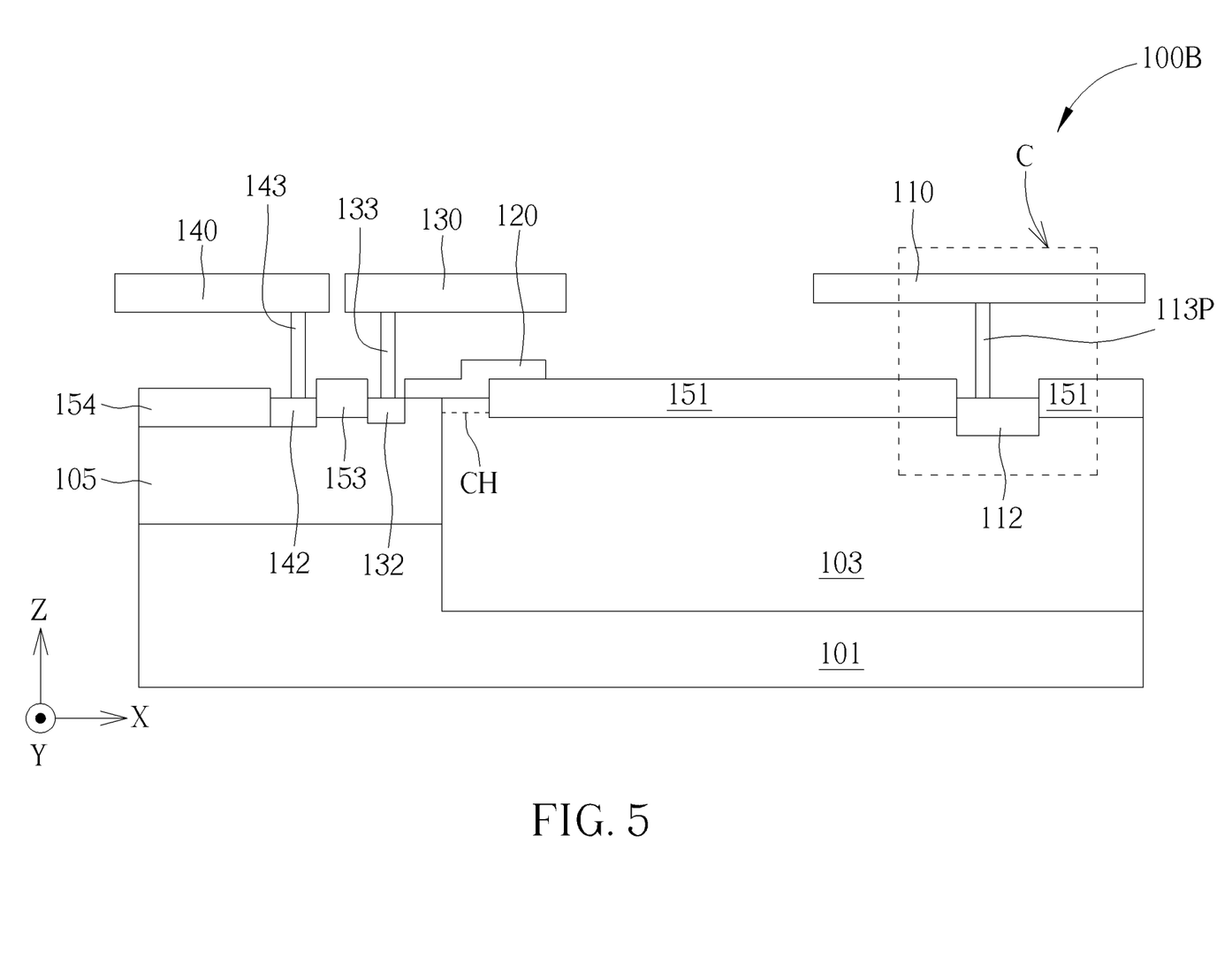
FIG. 5 is a schematic cross-sectional view of a semiconductor device according to another embodiment of the present disclosure.

FIG. 5 is a schematic cross-sectional view of a semiconductor device 100B according to another embodiment of the present disclosure. In one embodiment, the semiconductor device 100B is a depletion-mode metal oxide semiconductor field effect transistor (D-mode MOSFET), which is an initial-on semiconductor device. As shown in FIG. 5, the semiconductor device 100B includes a first well region 103 disposed in a substrate 101. The first well region 103 has a first conductivity type, such as a high-voltage n-type well region (HVNW). The substrate 101 has a second conductivity type opposite to the first conductivity type, such as a p-type silicon substrate (PSUB). A drain region 112 is disposed in the first well region 103. The drain region 112 has the first conductivity type, such as an n-type heavily doped region (N$^+$). The drain region 112 is electrically connected to the drain electrode 110 through a plurality of drain contacts 113P. In order to make the drawing clear and easy to understand, FIG. 5 shows the simplified drawing of the drain region 112 and the drain contacts 113P. The detailed structure of the drain region 112 and the drain contacts 113P in the area C of FIG. 5 may refer to the aforementioned descriptions of FIG. 3 and FIG. 4. Referring to FIG. 3 and FIG. 5, in one embodiment, the drain region 112 of the semiconductor device 100B includes a plurality of drain segments 112P that are laterally separated from each other. These drain segments 112P have the first conductivity type, such as n-type heavily doped regions (N$^+$). In addition, multiple isolation blocks 150P are disposed in the drain region 112 and respectively located between the adjacent drain segments 112P. These drain segments 112P are separated from each other by these isolation blocks 150P. Referring to FIG. 4 and FIG. 5, in another embodiment, there is no isolation block disposed between these drain segments 112P in the drain region 112 of the semiconductor device 100B. These drain segments 112P are separated from each other in the first well region 103. The semiconductor device 100B also includes a plurality of drain contacts 113P electrically connected to the drain segments 112P respectively. Each drain segment 112P corresponds to at least one drain contact 113P, and these drain contacts 113P are electrically connected to the drain electrode 110 in parallel.

Still referring to FIG. 5, the semiconductor device 100B further includes a second well region 105 disposed in the substrate 101. The second well region 105 has a second conductivity type, such as a p-type well region (PW), and the second well region 105 is adjacent to the first well region 103. The bottom surface of the first well region 103 is lower than the bottom surface of the second well region 105. Moreover, a source region 132 is disposed in the second well region 105. The source region 132 has the first conductivity type, such as an n-type heavily doped region (N$^+$). The source region 132 is electrically connected to a source electrode 130 through a source contact 133. In addition, a first isolation region 151 is disposed on the first well region 103 and surrounds the drain region 112. A gate electrode 120 is disposed across the first well region 103 and the second well region 105. A portion of the gate electrode 120 is extended from a side of the first isolation region 151 onto the top surface of the first isolation region 151. Another portion of the gate electrode 120 is adjacent to the source region 132. In one embodiment, the gate electrode 120 may be formed of polysilicon. The drain region 112 and the gate electrode 120 are laterally separated by a distance, and a first isolation region 151 is located between the drain region 112 and the gate electrode 120. The distance between the drain region 112 and the gate electrode 120 is greater than the distance between the source region 132 and the gate electrode 120.

The semiconductor device 100B further includes a bulk contact region 142 disposed in the second well region 105. The bulk contact region 142 has the second conductivity type, such as a p-type heavily doped region (P$^+$). The bulk contact region 142 is electrically connected to a bulk electrode 140 through a bulk contact 143. The source region 132 is located between the bulk contact region 142 and the gate electrode 120. In addition, a third isolation region 153 is disposed between the source region 132 and the bulk contact region 142. A fourth isolation region 154 is disposed outside the bulk contact region 142. The third isolation region 153 and the fourth isolation region 154 are located on the second well region 105. In some embodiments, each of the first isolation region 151, the third isolation region 153 and the fourth isolation region 154 is, for example, a field oxide layer (FOX) or a shallow trench isolation region (STI). In this embodiment, the semiconductor device 100B is an n-channel depletion-mode MOSFET. When no voltage is applied to the gate electrode 120, the source region 132 and the drain region 112 is conducted through an n-type channel region CH, i.e., this depletion-mode MOSFET is an initial-on semiconductor device.

Figure 6:
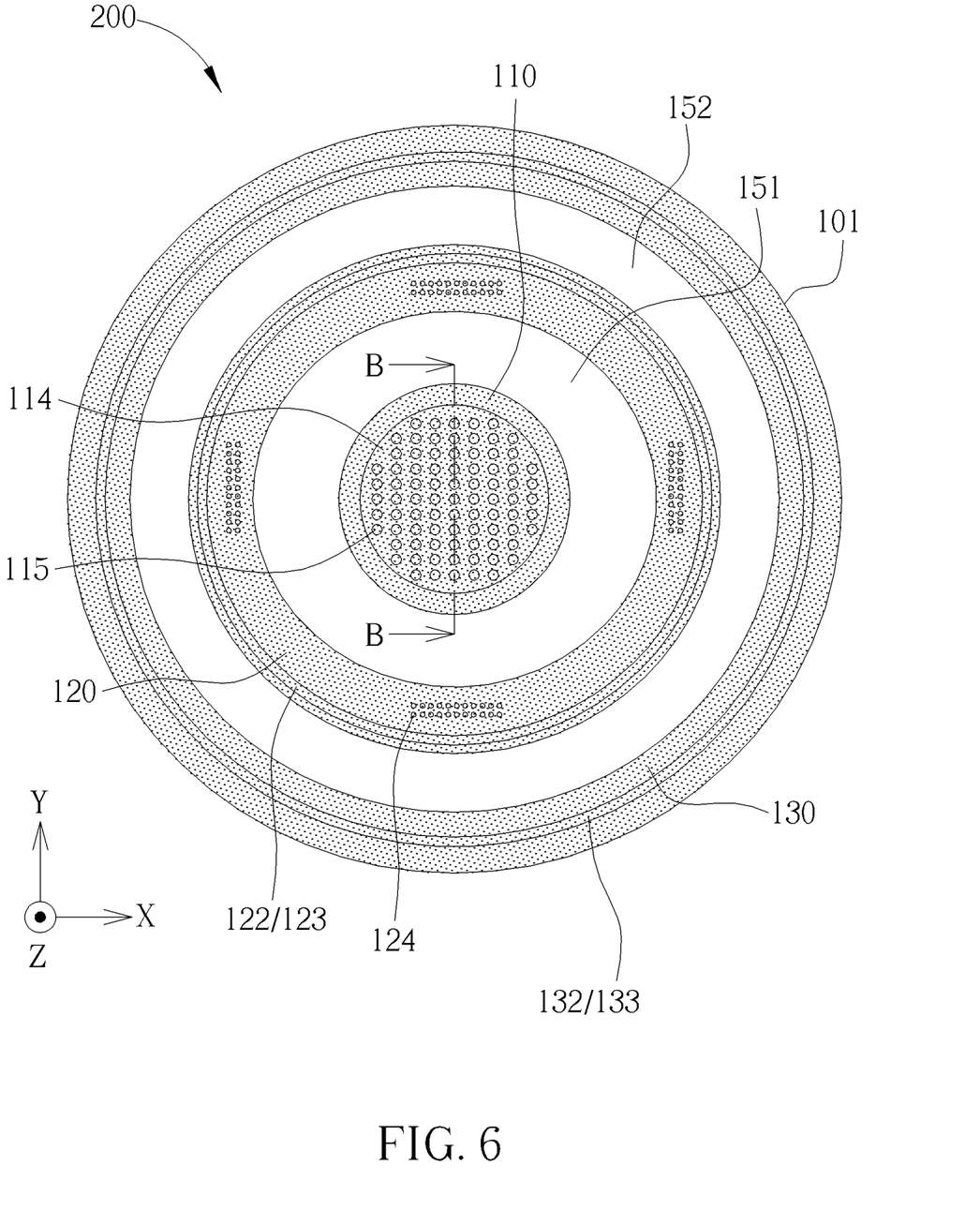
FIG. 6 is a schematic top view of a semiconductor device according to another embodiment of the present disclosure.

FIG. 6 is a schematic top view of a semiconductor device 200 according to another embodiment of the present disclosure. The semiconductor device 200 includes a drain region 114 that is a circular block in a top view. The drain region 114 of the semiconductor device 200 is not divided into multiple segments. In addition, a plurality of drain contacts 115 correspond to and are electrically connected to the same circular block of the drain region 114, and the drain region 114 is electrically connected to a drain electrode 110 through these drain contacts 115. Other features of the semiconductor device 200, such as a gate electrode 120, a gate contact region 122, a gate contact 123, a contact 124, a source electrode 130, a source region 132, a source contact 133, a first isolation region 151 and a second isolation region 152 may refer to the aforementioned description of FIG. 1.

Figure 7:
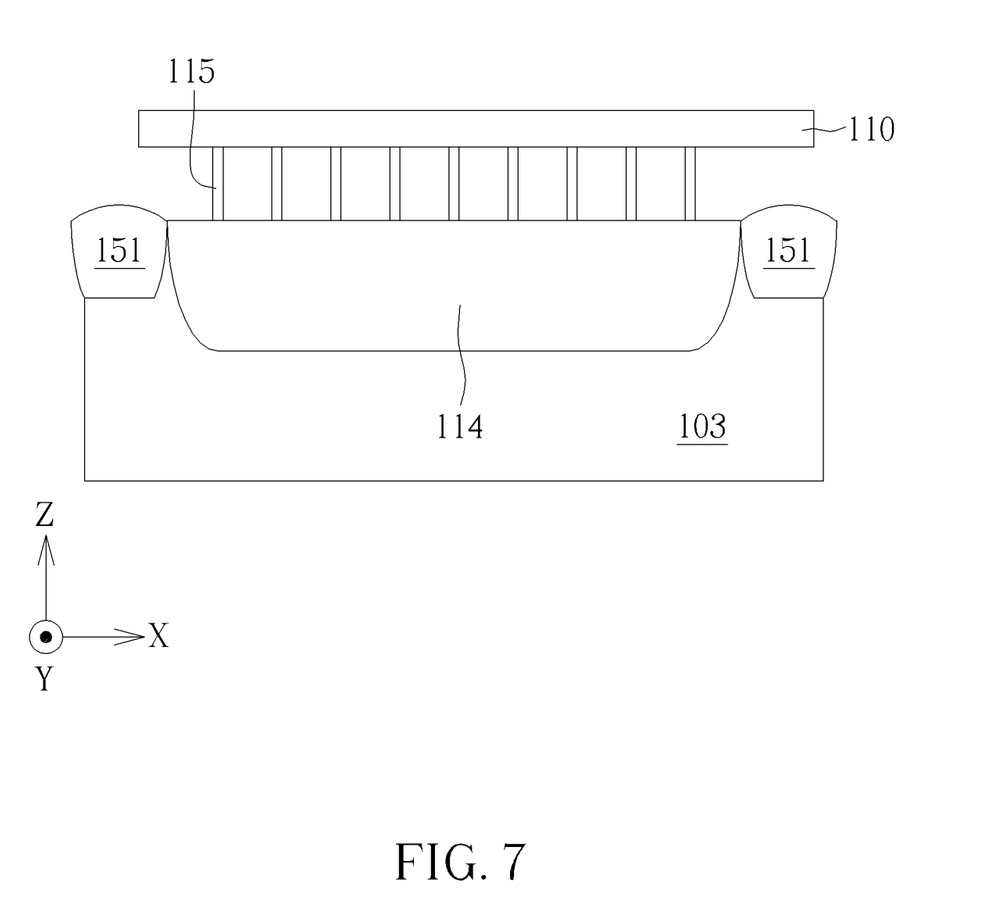
FIG. 7 is a schematic partial cross-sectional view of a semiconductor device along the line B-B in FIG. 6 according to another embodiment of the present disclosure.

FIG. 7 is a schematic partial cross-sectional view of the semiconductor device 200 along the line B-B in FIG. 6 according to another embodiment of the present disclosure. As shown in FIG. 7, the drain region 114 of the semiconductor device 200 is a block surrounded by the first isolation region 151. These drain contacts 115 correspond to and are electrically connected to the same block of the drain region 114, and these drain contacts 115 are further electrically connected to the drain electrode 110. In the semiconductor device 200, during electrostatic discharge (ESD) event, few drain contacts 115 located at the corner of the drain region 114 are more susceptible to ESD current than the drain contacts 115 at other locations (such as at the central region of the drain region 114). Accordingly, these drain contacts 115 at the corner of the drain region 114 are burned by the ESD current. It would be provided from a human body mode (HBM) 4000 volt (4 kV) ESD test that few drain contacts 115 located at the corner of the drain region 114 of the semiconductor device 200 of FIG. 6 are burned by the ESD current and have a charred state. In addition, all the drain contacts 113 in the drain region 112 of the semiconductor device 100 of FIG. 1 have a charred state with uniform distribution, which gives evidence that these drain contacts 113P of the semiconductor device 100 spread the ESD current uniformly. In the semiconductor device 200 of FIG. 6, few drain contacts 115 located at the corner of the drain region 114 spread the ESD current. According to the embodiments of the present disclosure, the semiconductor device 100 including multiple drain segments 112P that are laterally separated from each other has better and uniform ESD current discharging capability. Therefore, the semiconductor devices of the present disclosure obtain better ESD protection capability, which is suitable for ultra-high voltage (UHV) devices, such as UHV devices operated at voltages in a range of greater than 200V to 1000V.

Figure 8:
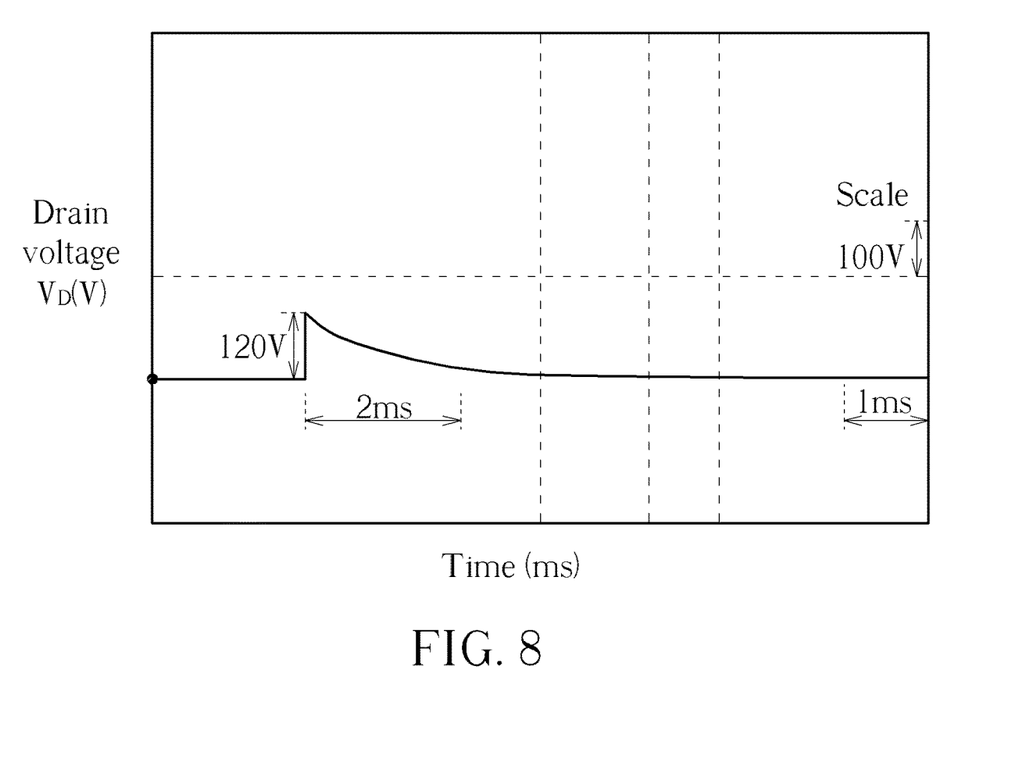
FIG. 8 is an oscillogram showing the drain voltage versus time of the semiconductor device of FIG. 6 according to an embodiment of the present disclosure under a human body mode test.

FIG. 8 is an oscillogram showing the drain voltage $V_D$ versus time of the semiconductor device 200 of FIG. 6 under a human body discharge mode (HBM) 200V ESD test according to an embodiment of the present disclosure, where the vertical axis is the drain voltage $V_D$ with an unit of volt (V), and the horizontal axis is time with an unit of millisecond (ms). As shown in FIG. 8, the peak voltage of the HBM waveform of the semiconductor device 200 is 120V, and the pulse width of the HBM waveform is 2 ms.

Figure 9:
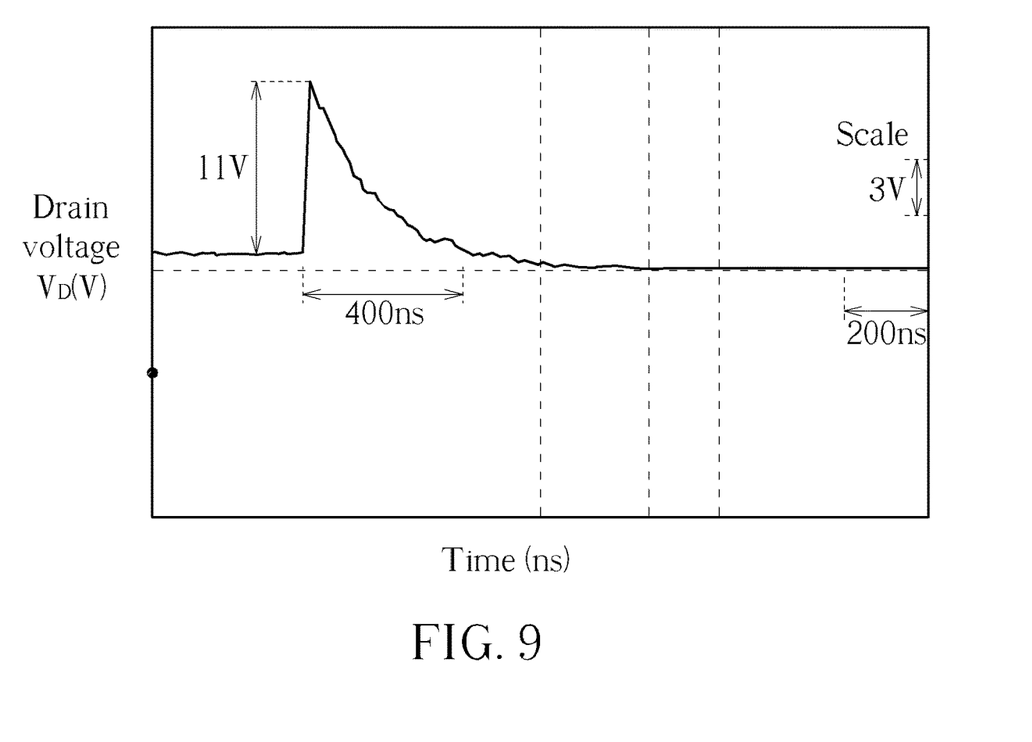
FIG. 9 is an oscillogram showing the drain voltage versus time of the semiconductor device of FIG. 1 according to an embodiment of the present disclosure under a human body mode test.

FIG. 9 is an oscillogram showing the drain voltage $V_D$ versus time of the semiconductor device 100 of FIG. 1 under the HBM 200V ESD test according to an embodiment of the present disclosure, wherein the vertical axis is the drain voltage $V_D$ with an unit of volt (V), and the horizontal axis is time with an unit of nanosecond (ns). As shown in FIG. 9, the peak voltage of the HBM waveform of the semiconductor device 100 is 11V, and the pulse width of the HBM waveform is 400 ns.

In some embodiments of the present disclosure, the semiconductor device 100 includes multiple drain segments 112P that are laterally separated from each other. From the HBM waveform of FIG. 8 and FIG. 9, it would be known that when the semiconductor device 100 and the semiconductor device 200 are subjected to ESD event, compared with the HBM waveform of the semiconductor device 200, the peak voltage of the HBM waveform of the semiconductor device 100 is lower, such as from 120V to 11V, and the pulse width of the HBM waveform of the semiconductor device 100 is narrower, such as from 2 ms to 400 ns. FIG. 8 and FIG. 9 give evidence that according to some embodiments of the present disclosure, the semiconductor device 100 effectively reduces the energy generated by ESD at the drain region to lower the potential of the drain. The semiconductor devices of the embodiments of the present disclosure spread the energy generated by ESD at the drain uniformly through the multiple drain segments 112P that are laterally separated from each other, thereby obtaining better ESD protection capability.

The semiconductor devices of the embodiments of the present disclosure include a plurality of drain segments that are laterally separated from each other. These drain segments are used as the ESD protection component of the semiconductor devices and do not occupy the layout area of the semiconductor devices, which is conducive to the miniaturization of the size of the semiconductor devices. Moreover, the semiconductor devices of the embodiments of the present disclosure do not have the problem of the conventional ESD protection component that is turned on more slowly than an initial-on semiconductor device. Moreover, these drain segments of the semiconductor device may be used as small resistors, and are electrically connected to the drain electrode in parallel through their respective drain contacts, thereby spreading the ESD current uniformly to enhance the ability of the semiconductor devices of the present disclosure to withstand ESD. Therefore, the semiconductor devices of the present disclosure have better ESD protection capability, which is conducive to the application for ultra-high voltage (UHV) devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a gate electrode, disposed on a substrate;
a source region and a drain region, disposed in the substrate and located on two sides of the gate electrode respectively, wherein the drain region comprises a plurality of drain segments that are laterally separated from each other, the plurality of drain segments have a first conductivity type and the substrate has a second conductivity type;
a plurality of drain contacts, disposed on the drain region, wherein each of the plurality of drain segments corresponds to at least one of the plurality of drain contacts;
a drain electrode, electrically connected to the plurality of drain contacts; and
a source electrode, electrically connected to the source region,
wherein the semiconductor device is a junction field effect transistor, and further comprises:
a first well region, disposed in the substrate and having the first conductivity type, wherein the source region and the drain region are disposed in the first well region;
a second well region, disposed in the first well region and having the second conductivity type; and
a gate contact region, disposed in the second well region, having the second conductivity type, and electrically connected to the gate electrode.

2. The semiconductor device of claim 1, further comprising a plurality of isolation blocks disposed in the drain region and respectively located between adjacent drain segments of the plurality of drain segments.

3. The semiconductor device of claim 2, wherein each of the plurality of isolation blocks comprises a field oxide layer or a shallow trench isolation region.

4. The semiconductor device of claim 1, wherein the plurality of drain contacts are electrically connected to the drain electrode in parallel.

5. The semiconductor device of claim 1, wherein a distance between the drain region and the gate electrode is greater than a distance between the source region and the gate electrode.

6. The semiconductor device of claim 1, further comprising:
a first isolation region, disposed between the drain region and the gate contact region;
a field plate, disposed on the first isolation region, wherein the field plate is electrically connected to the gate electrode; and
a second isolation region, disposed between the source region and the gate contact region.

7. The semiconductor device of claim 1, further comprising:
a third well region, disposed in the substrate, having the second conductivity type and adjacent to the first well region;
a bulk contact region, disposed in the third well region and having the second conductivity type; and
a bulk electrode, electrically connected to the bulk contact region, wherein the source electrode is located between the bulk electrode and the gate electrode.

8. The semiconductor device of claim 7, wherein the substrate has the second conductivity type, and a bottom surface of the first well region is lower than a bottom surface of the second well region and a bottom surface of the third well region.

9. The semiconductor device of claim 7, wherein the second well region and the third well region are laterally separated from each other, and a portion of the first well region is located between the second well region and the third well region.

10. The semiconductor device of claim 1, being a depletion-mode metal oxide semiconductor field effect transistor, and further comprising:
a first well region, disposed in the substrate and having the first conductivity type, wherein the drain region is disposed in the first well region; and
a second well region, disposed in the substrate, having the second conductivity type and adjacent to the first well region, wherein the source region is disposed in the second well region and has the first conductivity type.

11. The semiconductor device of claim 10, further comprising an isolation region disposed on the first well region and between the drain region and the gate electrode, wherein a portion of the gate electrode is extended from a side of the isolation region onto a top surface of the isolation region.

12. The semiconductor device of claim 11, wherein the drain region and the gate electrode are laterally separated by a distance, and another portion of the gate electrode is located adjacent to the source region.

13. The semiconductor device of claim 10, wherein the gate electrode is disposed across the first well region and the second well region.

14. The semiconductor device of claim 10, further comprising:
a bulk contact region, disposed in the second well region and having the second conductivity type; and
a bulk electrode, electrically connected to the bulk contact region, wherein the source electrode is located between the bulk electrode and the gate electrode.

15. The semiconductor device of claim 1, wherein in a layout from a top view, the drain electrode comprises a circular shape, the gate electrode comprises an annular shape surrounding the drain electrode, and the source electrode comprises another annular shape surrounding the gate electrode.

16. The semiconductor device of claim 15, wherein in the layout, the plurality of drain segments and the plurality of drain contacts are located within the area of the circular shape of the drain electrode.

17. The semiconductor device of claim 15, wherein in the layout, the gate electrode is electrically connected to a gate contact region through at least one gate contact having an annular shape, and the gate electrode is electrically connected to a field plate through a plurality of contacts, and the at least one gate contact and the plurality of contacts are located within the area of the annular shape of the gate electrode.

18. The semiconductor device of claim 15, wherein in the layout, the source electrode is electrically connected to the source region through at least one source contact having an annular shape, and the at least one source contact is located within the area of the annular shape of the source electrode.

* * * * *